United States Patent
McGraw et al.

(10) Patent No.: US 11,946,131 B2
(45) Date of Patent: Apr. 2, 2024

(54) SUBLIMATION CELL WITH TIME STABILITY OF OUTPUT VAPOR PRESSURE

(71) Applicant: Universal Display Corporation, Ewing, NJ (US)

(72) Inventors: Gregory McGraw, Yardley, PA (US); Edwin Van Den Tillaart, Eindhoven (NL); William E. Quinn, Whitehouse Station, NJ (US); Sven Pekelder, Eindhoven (NL); Matthew King, Evesham, NJ (US)

(73) Assignee: Universal Display Corporation, Ewing, NJ (US)

( * ) Notice: Subject to any disclaimer, the term of this patent is extended or adjusted under 35 U.S.C. 154(b) by 54 days.

(21) Appl. No.: 15/982,187

(22) Filed: May 17, 2018

(65) Prior Publication Data
US 2018/0340253 A1 Nov. 29, 2018

Related U.S. Application Data

(60) Provisional application No. 62/511,728, filed on May 26, 2017.

(51) Int. Cl.
*C23C 14/24* (2006.01)
*C23C 14/12* (2006.01)
(Continued)

(52) U.S. Cl.
CPC ............ *C23C 14/243* (2013.01); *C23C 14/12* (2013.01); *C23C 14/228* (2013.01); *H10K 50/11* (2023.02);
(Continued)

(58) Field of Classification Search
CPC .................................................... C23C 14/243
See application file for complete search history.

(56) References Cited

U.S. PATENT DOCUMENTS

| | | | |
|---|---|---|---|
| 4,769,292 A | 9/1988 | Tang | |
| 5,247,190 A | 9/1993 | Friend | |

(Continued)

FOREIGN PATENT DOCUMENTS

| | | | |
|---|---|---|---|
| CN | 1291241 A | 4/2001 | |
| CN | 1955332 A | 5/2007 | |

(Continued)

OTHER PUBLICATIONS

Baldo, "Highly efficient phosphorescent emission from organic electroluminescent devices," Nature, vol. 395, pp. 151-154, 1998.
(Continued)

*Primary Examiner* — Keath T Chen
(74) *Attorney, Agent, or Firm* — Butzel Long

(57) ABSTRACT

Designs and arrangements for sublimation cells are provided, which enriches an inert carrier gas with organic vapor such that the partial pressure of the organic vapor is highly stable in time. Stability is achieved by controlling the local rates of evaporation along the solid-gas interface through one or more crucibles, thereby reducing the effects of greater headspace and lowering interfacial area as the source depletes. Local evaporation rates also can be controlled using either temperature distribution or convective flow fields.

12 Claims, 14 Drawing Sheets

(51) Int. Cl.
*C23C 14/22* (2006.01)
*H10K 50/11* (2023.01)
*H10K 50/15* (2023.01)
*H10K 50/16* (2023.01)
*H10K 50/18* (2023.01)
*H10K 50/81* (2023.01)
*H10K 50/82* (2023.01)
*B05D 1/00* (2006.01)
*H10K 71/16* (2023.01)

(52) U.S. Cl.
CPC ............ *H10K 50/15* (2023.02); *H10K 50/16* (2023.02); *H10K 50/18* (2023.02); *H10K 50/81* (2023.02); *H10K 50/82* (2023.02); *B05D 1/60* (2013.01); *H10K 71/16* (2023.02)

(56) References Cited

U.S. PATENT DOCUMENTS

| | | | |
|---|---|---|---|
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,195,504 B1* | 2/2001 | Horie | C23C 16/448 392/394 |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,279,704 B2 | 10/2007 | Walters | |
| 7,431,968 B1 | 10/2008 | Shtein | |
| 7,968,146 B2 | 6/2011 | Wagner | |
| 2003/0230980 A1 | 12/2003 | Forrest | |
| 2004/0016404 A1* | 1/2004 | Gregg | F17C 11/00 118/726 |
| 2004/0174116 A1 | 9/2004 | Lu | |
| 2005/0186340 A1* | 8/2005 | Long | H10K 71/164 427/255.6 |
| 2006/0062915 A1* | 3/2006 | Long | C23C 14/24 427/248.1 |
| 2008/0085226 A1* | 4/2008 | Fondurulia | C23C 16/4401 422/198 |
| 2009/0107401 A1* | 4/2009 | Reinhold | C23C 14/228 118/726 |
| 2010/0080901 A1* | 4/2010 | Hein | C23C 14/12 427/255.6 |
| 2015/0191819 A1* | 7/2015 | Hendrix | B01B 1/005 118/728 |
| 2017/0022963 A1 | 1/2017 | DeBenedictis | |
| 2018/0340253 A1 | 11/2018 | McGraw | |

FOREIGN PATENT DOCUMENTS

| | | |
|---|---|---|
| JP | 2012504188 A | 2/2012 |
| KR | 20050021558 A | 3/2005 |
| KR | 20150020624 A | 2/2015 |
| WO | 2008057394 A1 | 5/2008 |
| WO | 2010011390 A2 | 1/2010 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Chinese Office Action with English translation for App. No. CN201810520555.7, dated Feb. 23, 2021, 9 pages.

Korean Office Action (including English translation) issued in App. No. KR10-2018-0059489, dated Feb. 28, 2023, 9 pages.

* cited by examiner

SUBLIMATION CELL WITH TIME STABILITY OF OUTPUT VAPOR PRESSURE

CROSS-REFERENCE TO RELATED APPLICATIONS

This application is a non-provisional of, and claims the priority benefit of U.S. Provisional Patent Application Ser. No. 62/511,728, filed May 26, 2017, the entire contents of which are incorporated herein by reference.

FIELD

The present invention relates to a sublimation cell with time-stable output vapor pressure for use in device fabrication techniques such as OVJP, techniques for using the same, and devices fabricated therefrom.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

Embodiments disclosed herein provide evaporative source cells for providing materials to be deposited via vapor deposition, and method of operating the same by providing the carrier gas through the source cells. In an embodiment, a source cell includes a first material crucible having a depression for holding a first material to be deposited via vapor phase deposition; a first heater configured to set a temperature of the first material crucible; and a second material crucible disposed downstream from the first material crucible. The second material crucible may include a depression for holding a second material to be deposited via vapor phase deposition, a first vent in fluid communication with the first material crucible, and a second heater configured to set a temperature of the second material crucible independently of the temperature of the first material crucible. More generally, the source cell may include any number of material crucibles, each of which may be heated independently of each other crucible in the source cell. For example, in an embodiment the source cell may include a third material crucible disposed downstream the second material crucible, which has the same general configuration as the first and second cells, and a third heater configured to set a temperature of the third material crucible independently of the temperature of the first and second material crucibles.

The source cell also may include the materials to be deposited using the cell, such as the first, second, and third materials. Each cell may include the same material, or different cells may include the same and/or different materials. The materials may be any suitable material to be deposited using an evaporative cell, such as one or more organic emissive materials or other materials suitable for fabrication of OLEDs and devices containing OLEDs as disclosed herein. The cell and/or the vents between the crucibles may include one or more inverting connections between adjacent crucibles, such as the first and second crucibles or the second and third crucibles. The crucibles may be arranged one above the other, side-by-side, or any other physical arrangement. During operation of the source cell, the source cell may be configured to maintain a temperature of the first crucible at a lower temperature than the second crucible. Similarly, the source cell may be configured to maintain a temperature of the second crucible at a lower temperature than the third crucible. The temperatures of the crucibles also may be changed over time.

In an embodiment, an evaporative source cell is provided that includes a plurality of carrier gas injection ports arranged around a central interior region of the cell and a material charge support to hold a source of evaporable material, where wherein the carrier gas injection ports are directed toward the material charge support at an angle sufficient to form a vortex of carrier gas above the material charge support during operation of the evaporative source cell. The cell also may include a splitter disposed within the central interior region of the cell to increase the path length of streamlines within the vortex of carrier gas. A central flue may allow for carrier gas to exit the evaporative source cell after contacting the evaporable material during operation of the evaporative source cell. The cell may include a source of carrier gas in fluid communication with the plurality of carrier gas injection ports, and/or a vacuum source in fluid communication with the flue.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
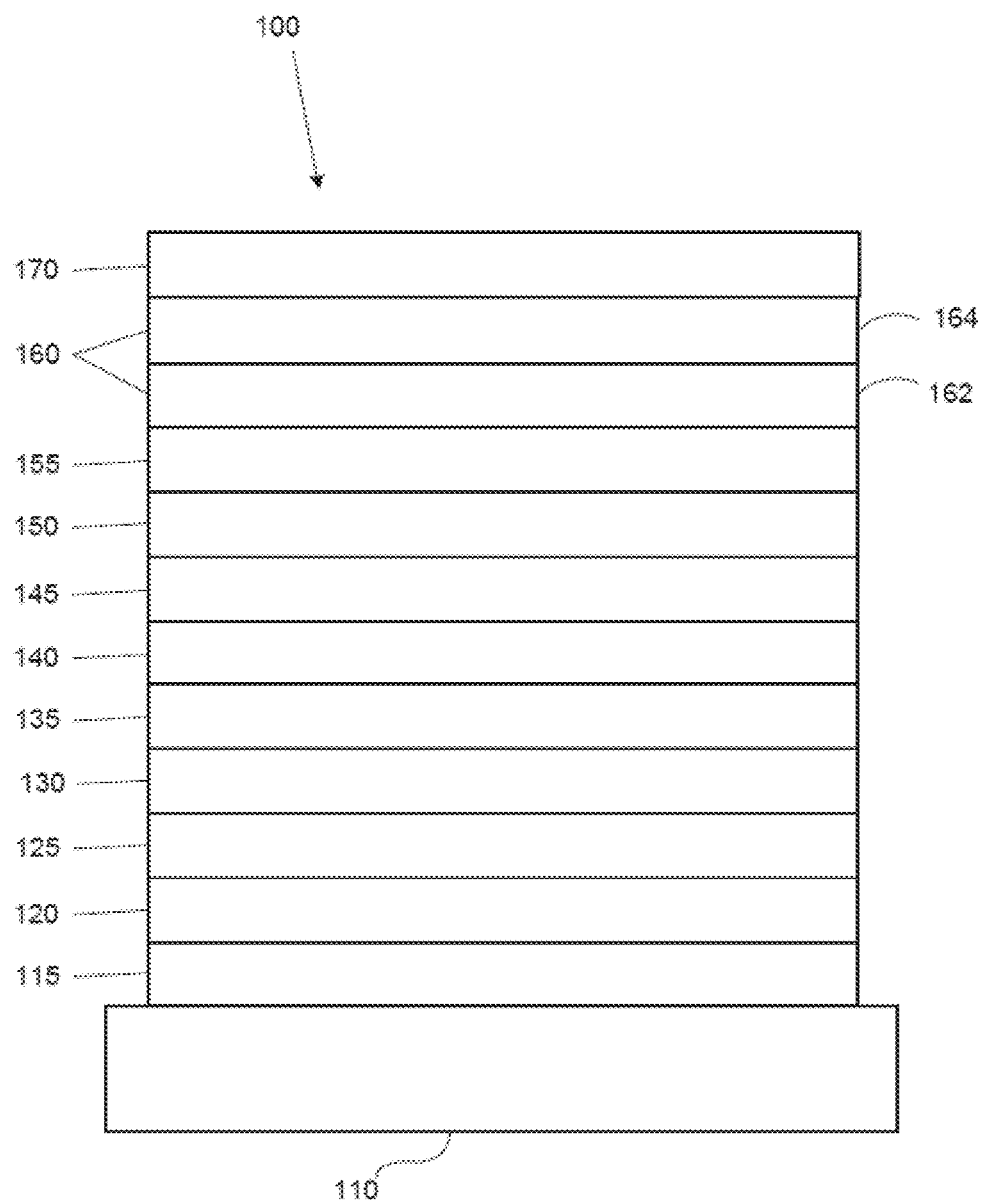
FIG. 1 shows an organic light emitting device that may be fabricated using embodiments disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
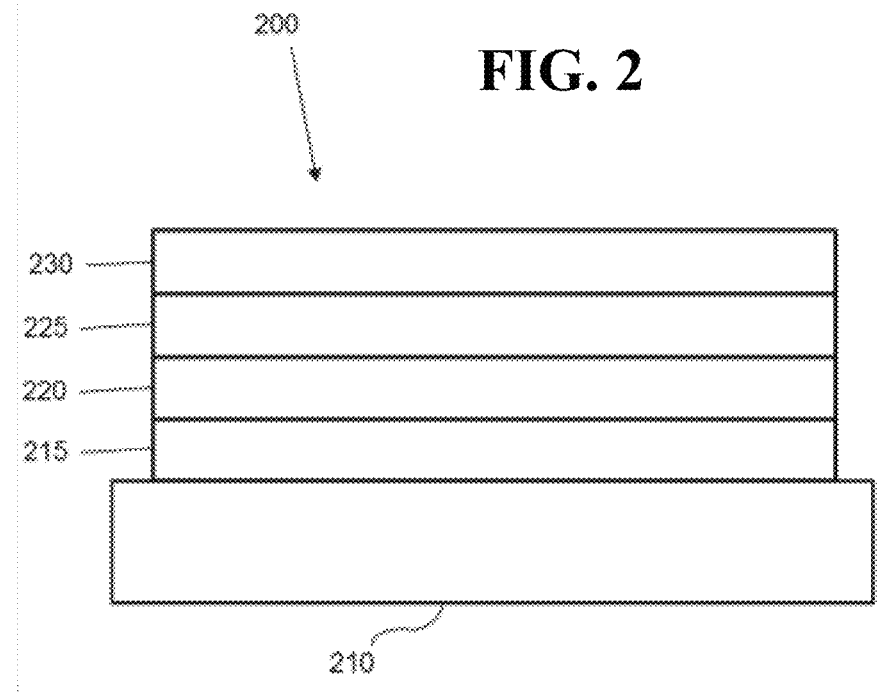
FIG. 2 shows an inverted organic light emitting device that does not have a separate electron transport layer that may be fabricated using embodiments disclosed here.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Figure 3:
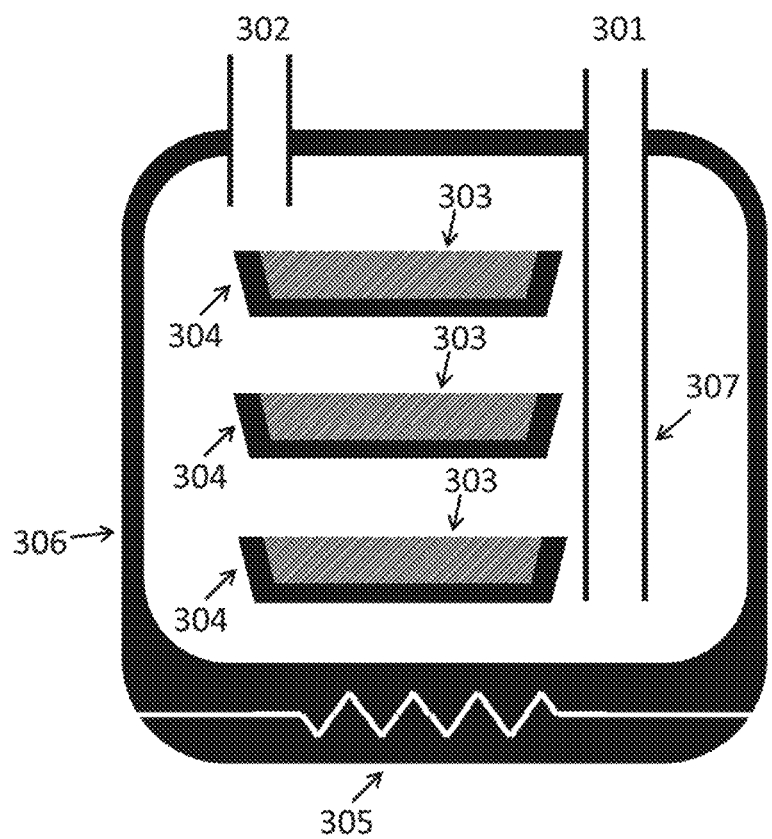
FIG. 3 shows a schematic diagram of an evaporation source cell.

Various vapor phase deposition techniques may be used to fabricate OLEDs and other devices. For example, physical vapor deposition (PVD) and chemical vapor deposition (CVD) processes deliver condensable vapor onto a substrate using an inert carrier gas. The carrier gas picks up vapors in one or more evaporation cells upstream of the substrate. A schematic representation of a generalized evaporation cell is illustrated in cross section in FIG. 3. The cell contains inlet ports 301 and outlet ports 302 for the carrier gas to enter and exit the cell, respectively. A charge of condensed material 303 is held in one or more trays or crucibles 304. The material charge may be either solid or liquid. In operation, an evaporator cell as shown in FIG. 3 is evenly heated to a constant temperature. The walls 306 typically are thermally conductive. Heat can be provided, for example, by resistive heating elements 305 that are monitored by thermocouples. The flow path of carrier gas through the evaporation cell may be designed to maximize the surface area of the bed of the material charge. This may be done, for example, by dividing the material charge between multiple trays and introducing carrier through a long injector tube 307 so that it must flow across the entire height of the source cell.

The molar flux of dilute vapor j at the interface between the material charge and gas flow depends on four factors, the diffusivity D of the sublimate vapor, the velocity of the gas flow $\underline{u}$, the characteristic headspace L above the material charge, and the equilibrium vapor pressure $P_v^*$ of the sublimate. The relation is shown in Equation 1:

$$j = h\frac{1}{RT}(P_v^* - P_v) \tag{1}$$

It also depends upon $P_v$, the partial pressure of sublimate vapor in gas in that region. This is, in turn, determined by D, $\underline{u}$, and $P_v^*$ upstream. The behavior of the source at any given location can therefore be dependent on the components upstream of it. R is the ideal gas constant and T is temperature. The mass transfer coefficient h is given by eq. 2, where the Nusselt number Nu is a function of both flow field and source vessel geometry:

$$h = Nu\left(\frac{D}{L}\right) \quad (2)$$

The saturation $\Theta=(P_v/P_v^*)$ of the source effluent is an important figure of merit. Vapor will diffuse into the gas stream until it saturates ($\Theta=1$) for an arbitrarily large interfacial area. The size of the source is, however, often limited by design considerations. It is desirable for a source to operate with $\Theta$ close to unity for a wide range of carrier gas flow rates Q and to be stable in time. Process variables like T, Q, and the molar composition of the carrier gas, as well as the geometry of the source vessel may be optimized to obtain the desired performance. Time dependence in $\Theta$ arises because the volume of a material charge decreases as it evaporates. This changes both the surface area of the charge and the shape of the headspace over it. Time dependence is reduced if j is evenly distributed across the vapor charge.

Figure 4A:
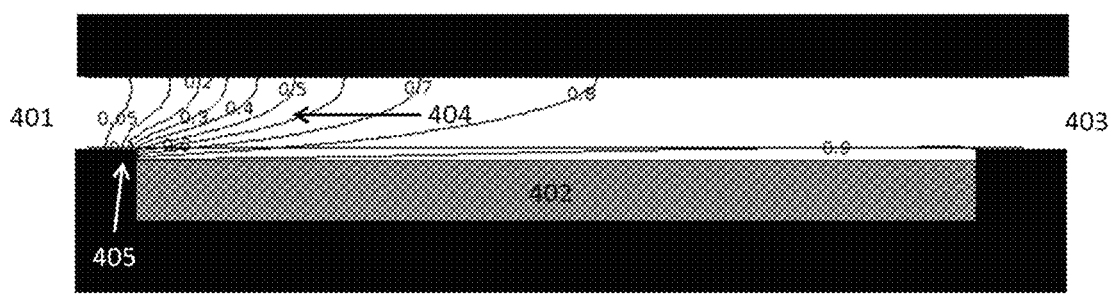
FIG. 4A shows a cross section of a fully-loaded evaporation source tray.

A simple source design is illustrated in FIG. 4A. Carrier gas enters from the left of the cell 401, flows over the material charge 402, and exits through an outlet on the right 403. The plotted contours 404 show $\Theta$. It can be seen that the vapor flux is highest along the leading edge 405 of the material charge.

Figure 4B:
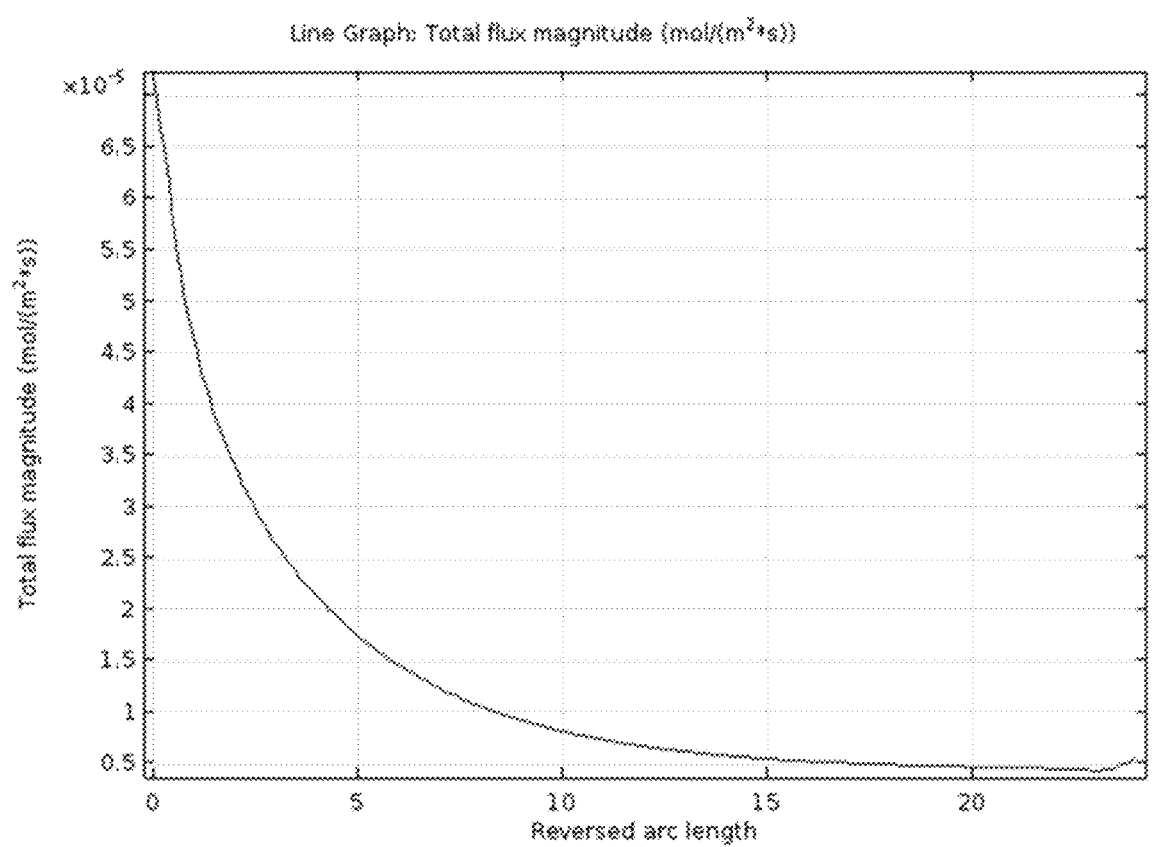
FIG. 4B shows a plot of evaporation rate vs. position for a source tray as shown in FIG. 4A.

As a specific example, the carrier gas may flow through the source at 30 sccm. FIG. 4B shows a plot of j in mol/m² on the vertical axis over linear distance x in centimeters downstream from the leading edge of the material charge. Notably, the flux precipitously decreases downstream of the leading edge. While the data shown in FIG. 4B is generated by numerical simulations, this source behavior also can be understood analytically. Equation 3 gives Nu for the vicinity of the leading edge of a mass transfer surface in a fully developed laminar flow:

$$Nu = 0.98 \sqrt[3]{\frac{uL^2}{Dx}} \quad (3)$$

The singularity at x=0 corresponds to a region of high but finite flux due to the absence of vapor in the carrier gas. Flux slows as a diffusive boundary layer of vapor laden carrier gas forms over the material charge downstream and slows further evaporation.

Figure 5A:
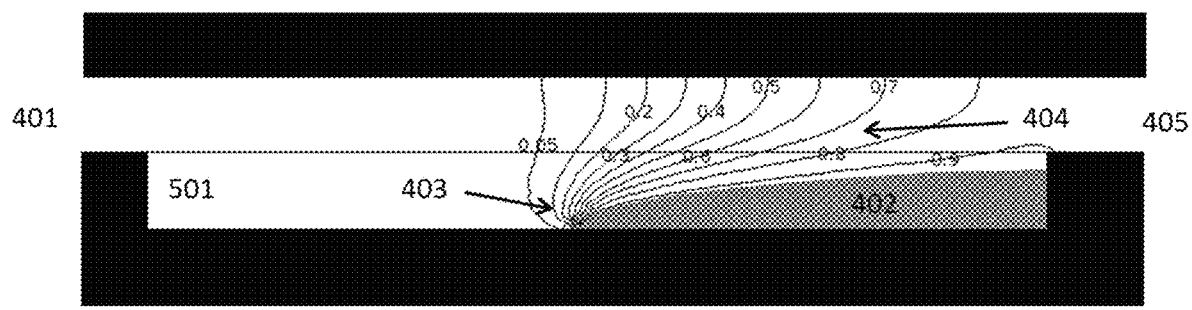
FIG. 5A shows a cross section of a partially-depleted evaporation source tray.
Figure 5B:
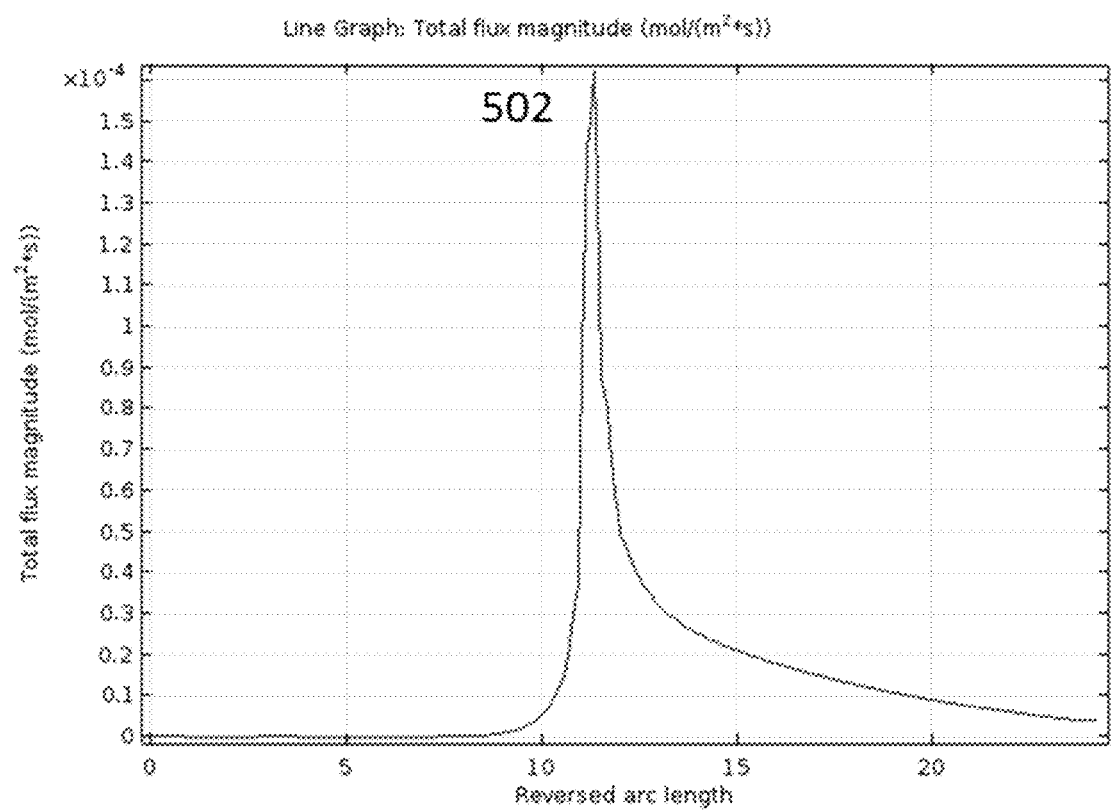
FIG. 5B and a plot of evaporation rate vs. position for a source tray as shown in FIG. 5A.
Figure 6:
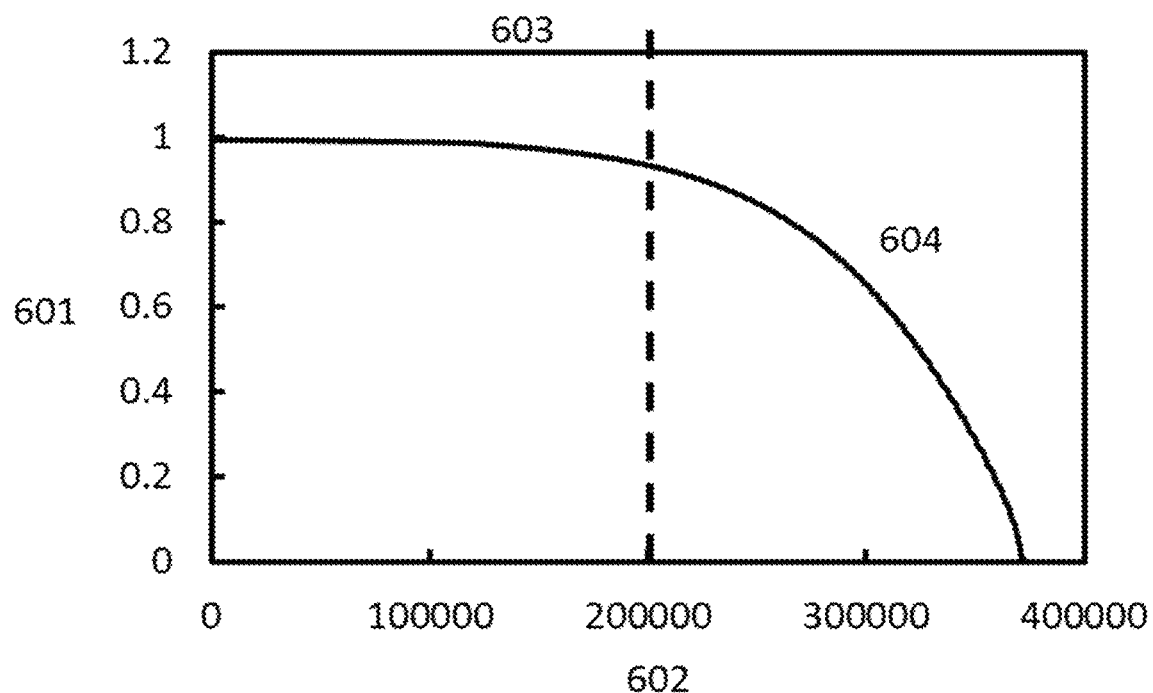
FIG. 6 shows a plot of the saturation of organic vapor in effluent gas from an evaporator as a function of time for a constant temperature source.

A consequence of uneven j is apparent in FIG. 5A, which shows the same source after 61 hours of operation. The charge of material has become totally depleted near the front of the crucible 501, moving the leading edge of the sublimation area backwards and reducing the area of the interface. The maximum of j 502, as plotted in FIG. 5B, moves backwards and the surface area of the charge is reduced. Evaporation from the downstream portions of charge becomes more rapid; however there is insufficient area for the exiting carrier gas to approach saturation. $\Theta$ is plotted in FIG. 6 on the vertical axis with respect to time t on the horizontal axis in seconds. It can be seen at 603 that $\Theta \geq 0.90$ when t<56 hrs but precipitously drops as the source further depletes at 604. Accordingly, in such a device, the source must be replenished to maintain a time-stable output.

A temperature gradient along the flow path of the source can improve the uniformity of j along the solid-vapor interface by modulating $P_v^*$. The relationship between T and $P_v^*$ is given by Equation 4, the Clausius-Clapyeron equation:

$$P_v^* = P_{v0}^* e^{-\frac{H_v}{RT}} \quad (4)$$

The coefficient $P_{v0}^*$ and enthalpy of vaporization $H_v$ both depend on the material being evaporated.

Figure 7A:
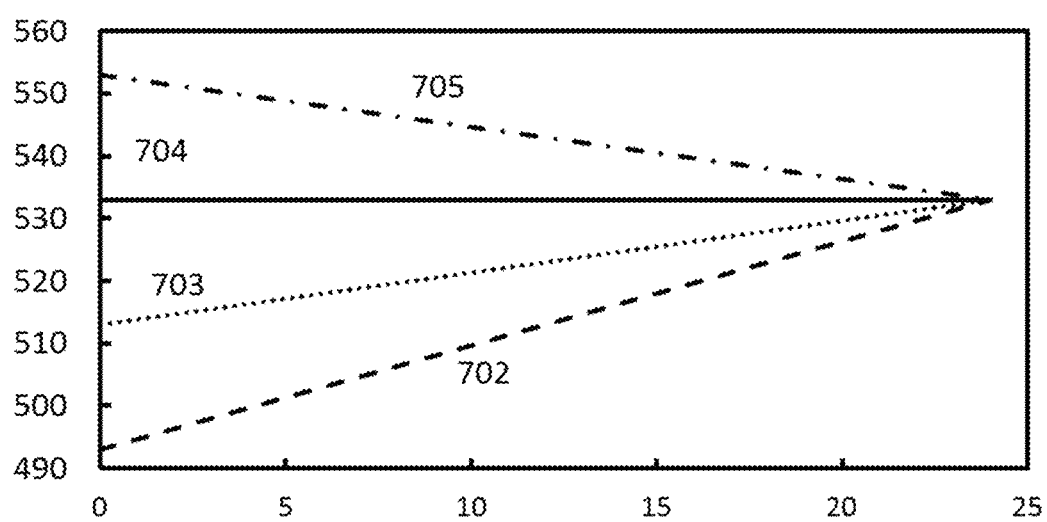
FIGS. 7A and 7B show plots of different temperature distribution along an evaporation source tray and the resulting profiles of organic vapor flux, respectively.
Figure 7B:
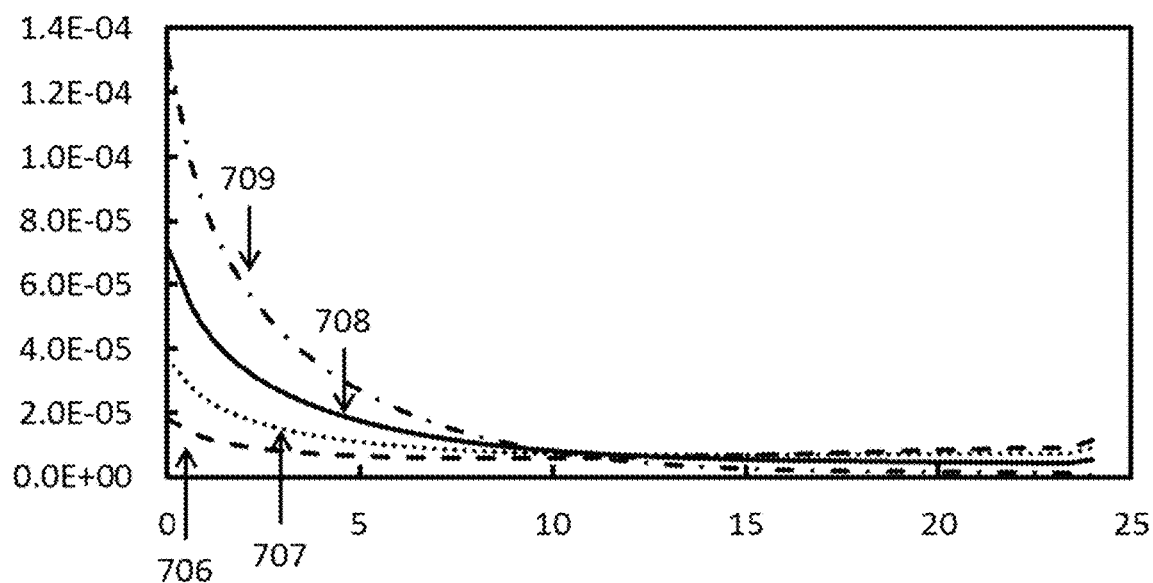

Lowering the temperature at the leading edge of the material charge by $\Delta T$ slows local evaporation and prevents the material source charge from receding as previously described. The temperature profiles for four sources are plotted as a function of position in FIG. 7A. The vertical axis 701 is the temperature T in K and the horizontal axis is the horizontal position x in cm. Profiles are shown for $\Delta T=-40K$ (702), $\Delta T=-20K$ (703), $\Delta T=0K$ (704), and $\Delta T=20K$ (705). FIG. 7B plots j vs. x for the source under various the temperature gradients. The evaporation rate is nearly constant across the length of the source for the $\Delta T=-40K$ case 706. The solid material charge is consumed evenly so its surface area remains constant. The flux is uniform but low. The $\Delta T=-20K$ case 707 generates greater initial flux than the $-40K$ case. The flux decreases downstream, but less so than the following cases. An isothermal source with $\Delta T=0K$ (708), evaporates material rapidly from the leading edge of the charge more rapidly than in the first two cases. Evaporation from its trailing edge is relatively slow. Heating the inlet relative to the downstream portions, such that $\Delta T=20K$ 709 produces very rapid evaporation from the leading and with negligible evaporation downstream.

Figure 8:
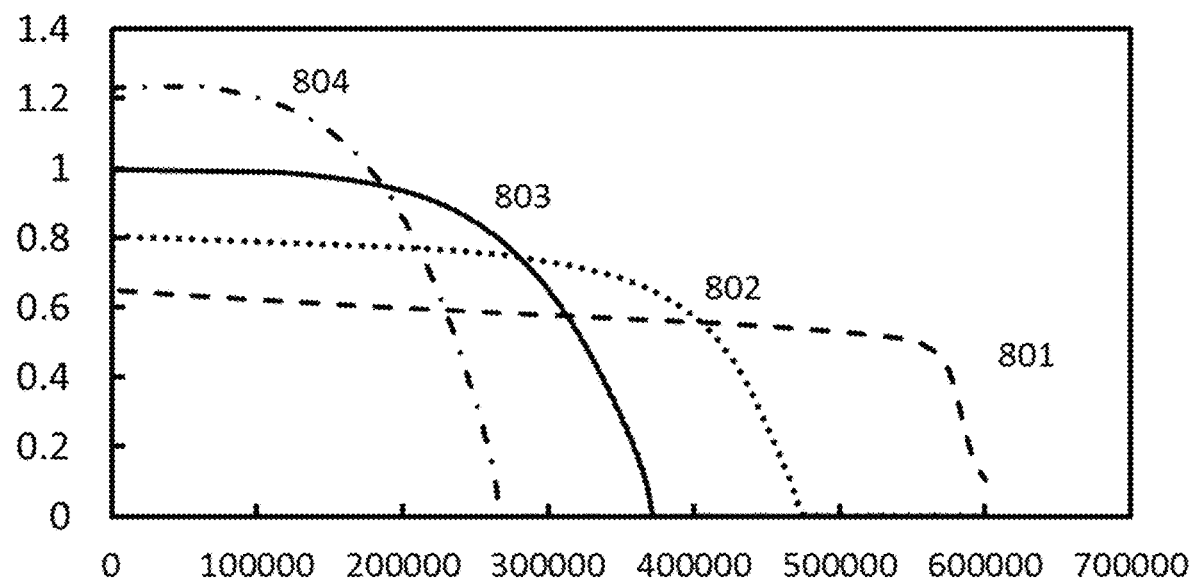
FIG. 8 shows plots of the saturation of organic vapor in effluent gas from an evaporator as a function of time for sources with various temperature distributions.

FIG. 8 shows a plot of $\Theta$ as a function of time t for the various temperature gradient cases. The $\Delta T=-40K$ case (801) is nearly time independent. Its lower saturation can be overcome by using a larger source with more surface area. The $\Delta T=-20K$ case at 802 is intermediate between the $\Delta T=-40K$ and $\Delta T=0K$ cases. The $\Delta T=0K$ case (803) starts with $\Theta$ near unity, but the saturation change quickly becomes unacceptable. Finally, the $\Delta T=20K$ case at 804 shows a more extreme version of the behavior of the $\Delta T=0K$ behavior. A noteworthy behavior of the $\Delta T=20K$ case is that the vapor stream leaving it is super-saturated, $\Theta>1$. Source properties are summarized in Table 1, which gives the initial saturation $\Theta$ (t=0), and the fraction of its material charge n that a source can deliver before its output saturation falls below 80% of the initial value.

TABLE 1

| $\Delta T$ (K) | c(0)/c* | η |
|---|---|---|
| −40 | 0.566 | 0.903 |
| −20 | 0.805 | 0.876 |
| 0 | 0.996 | 0.830 |
| 20 | 1.23 | 0.801 |

Figure 9A:
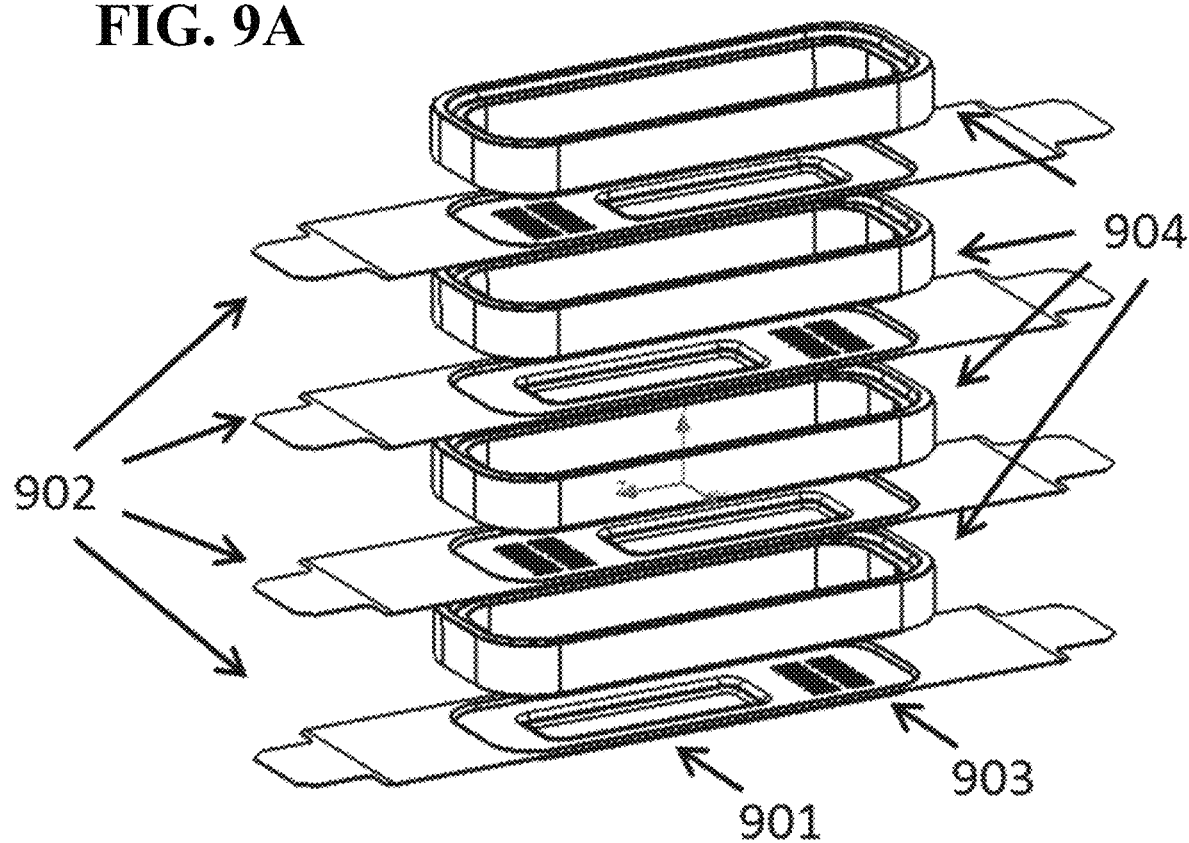
FIG. 9A shows a design for a modular, multi-tray sublimation source according to embodiments disclosed herein, in which the temperature of individual trays can be separately controlled.

Accordingly, it may be desirable to impose a thermal gradient on material source cells. FIG. 9A shows a practical implementation of a source cell that utilizes a thermal gradient according to embodiments disclosed herein. The material charge may be stored in one or more crucibles 901 which may be, for example, arranged in depressions stamped into metal trays 902. Each tray may include one or more vents 903 in fluid communication with the tray underneath it. Trays may be separated by spacers 904 that seal to them to form a closed flow path over the trays. In this arrangement, the carrier gas flow follows a zig-zag pattern through the tray stack, passing over each crucible.

Figure 9B:
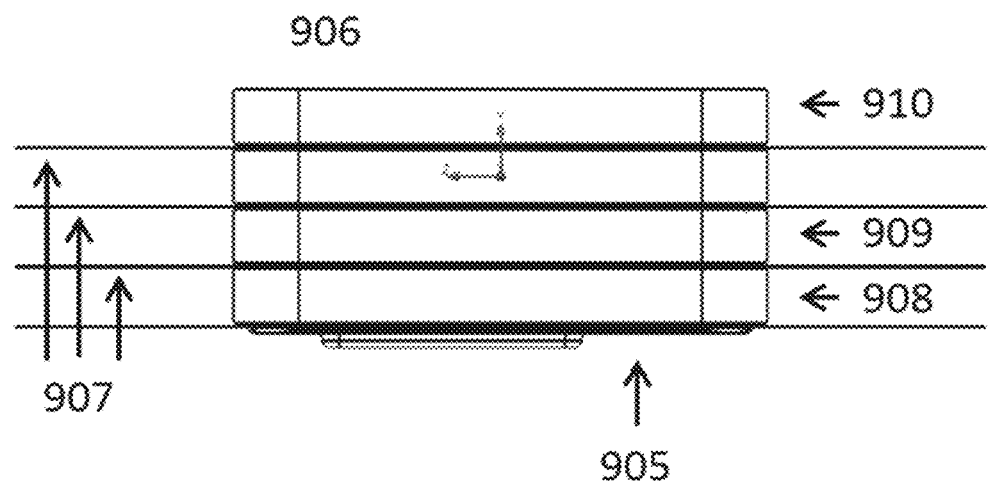
FIG. 9B shows a stack of trays as shown in FIG. 9A separated by spacers according to embodiments disclosed herein.

FIG. 9B shows a side view of a stack of four trays joined together by spacers. In this arrangement, carrier gas enters through the bottom of the lower tray at 905 and exits through the top of the uppermost spacer 906. The trays are held in place by one or more tabs 907 at each end of the tray. The tabs may contain, for example, contacts for heaters and thermocouples integral to the trays. The temperature of each tray may be independently controlled by way of such heaters and thermocouples or other similar mechanisms. For example, each tray may include one or more temperature monitoring device such as a thermometer, thermocouple, or the like, and one or more temperature adjustment devices such as a heater. The temperature of each crucible may be controlled by using the heater to set the temperature of the crucible, which may be selected based upon data provided by the thermometer or thermocouple. The temperature of each crucible may be controlled via integrated electronics such as an integrated processor. Alternatively or in addition, data from the temperature monitoring device for each crucible may be provided to an external processor, which may then control the heater for each crucible independently of each other heater.

A source as shown in FIGS. 9A-9B may be operated so that the upstream trays are at a lower temperature than the downstream trays, for example so that each tray is at a higher temperature than the preceding tray. During operation, carrier gas may be preheated to a temperature slightly lower than that of the first tray 908. The first tray then transfers both heat and organic vapor into the carrier gas as it flows across the tray. The next tray 909 may be held at a higher temperature than the first tray, and $P_v^*$ is higher for the material in the tray. The second tray then transfers more heat and material vapor to the carrier gas. The process continues until the carrier gas reaches the tray furthest downstream 910. Accordingly, carrier gas may leave the last tray in thermal equilibrium with Θ near unity. A thermal gradient in the direction of flow distributes heat and mass flux evenly over the surface area. Although shown disposed one over the other in FIGS. 9 and 10, it will be understood that other crucible arrangements may be used. For example, the crucibles may be aligned in series horizontally, while still maintaining the thermal gradient arrangement as disclosed. More generally, the crucibles may be arranged such that one is downstream from the other, i.e., as the carrier gas moves through the crucibles of a source cell as disclosed herein, it sequentially moves from an upstream crucible to a downstream crucible. A crucible that is arranged later in the sequence thus may be described as being "downstream" of one that occurs earlier in the sequence, regardless of whether the crucibles are stacked, arranged horizontally in series, or disposed in any other arrangement.

The thermal gradient may improve the stability of the source when compared to conventional vapor sources in several ways. First, evaporation may occur more evenly over the material surface. Therefore, the change in the surface of the material over time is slowed, while the saturation of effluent gas from the source remains more stable over time. Secondly, carrier gas may be gradually heated as it flows through the source. This spreads the heating load over the entire source and thereby reduces the load on upstream heating elements. Finally, the time over which a material charge can be stored in a source before degrading is often a function of temperature. Maintaining portions of the material charge at reduced temperatures may increase the period over which the source will generate vapor from high-quality source material. Furthermore, a source that produces higher quality material at a given point in its lifecycle generally is expected to provide better end results. For example, organic sources that provide a consistently high-quality material may be expected to grow OLEDs that have higher lifetimes than those made with inconsistent or lower-quality materials.

The thermal profile within the source may also be changed over time to reduce overall the temperature exposure of an organic vapor charge. For example, a source may begin a deposition process cycle after initial charging with the downstream trays heated to sublimation temperature and the upstream trays held at a significantly lower temperature. Material evaporates quickly from the hot, downstream trays. Before they are depleted, the trays immediately upstream are heated to sublimation temperature. The next set of upstream trays are then brought up to temperature as the second set of trays deplete. This pattern may continue for an arbitrarily long chain of trays. Depleted trays may be held at the sublimation temperature so that organic vapor does not re-condense onto them. Each aliquot of material may be exposed to the sublimation temperature for only a brief period before it evaporates. This reduces thermal degradation of the material within the source and may increase the interval over which a source can operate while also increasing the lifetime of OLED devices produced using the source.

Figure 10A:
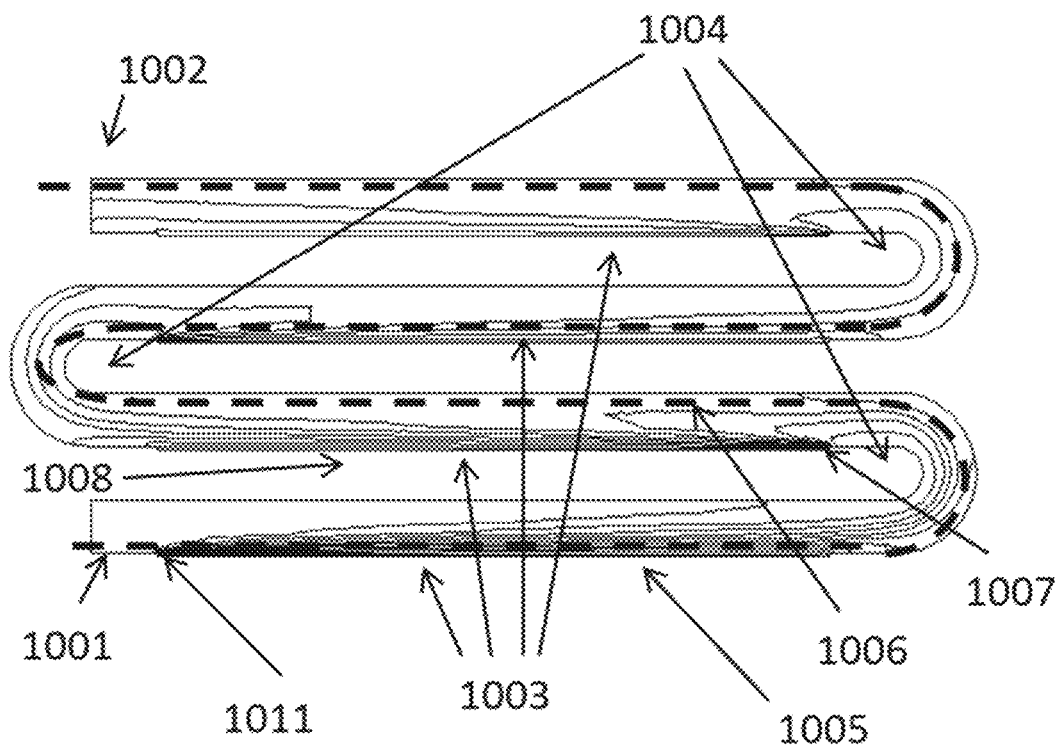
FIG. 10A shows an example of a flow path through a multi-tray sublimation source that mixes the fluid laminae contacting the material charge according to embodiments disclosed herein.

In an embodiment, mass transfer in a stacked tray configuration may be further improved by a flow path that inverts the carrier gas flow it passes between trays. FIG. 10A shows an example configuration of such a source. In this example, the carrier gas inlet 1001 is on the lower left and the outlet 1002 is on the upper left. The material charge is stored in a crucible at the base of each of the four straight sections 1003 of the flow path. In this illustration, the crucible itself is not shown in the plot, but rather it is represented as a boundary condition. The straight sections are connected by three u-bends. It will be understood that although four sections connected by three u-bends are shown, any number of sections and connections may be used in this and other examples disclosed herein. A contour plot of Θ is overlaid on the schematic flow path. This structure results in the carrier gas flow inverting as it moves from one straight section to the next. For example, laminae of carrier gas flow in contact with the material charge in one tray 1005 are near the top of the headspace 1006 of the next tray. Fresh laminae are brought into contact with the leading edge of the next tray, eliminating the diffusive boundary layer at its leading edge 1008. The boundary layer re-establishes itself further downstream, but is again cycled away from the material charge by the next u-bend. A streamline of laminar flow is provided by a dashed line to guide the eye. More generally, a connection such as the u-bend connection shown in FIG. 10A that "flips" or inverts the carrier gas flow as it moves between crucibles may be referred to as an "inverting connection" between the crucibles. Inverting connections as disclosed herein may include other arrangements as alternatives or in addition to the u-bend-type configuration shown. For example, any twisted, helical, or other flow path that inverts the carrier gas flow as previously disclosed may be used.

Figure 10B:
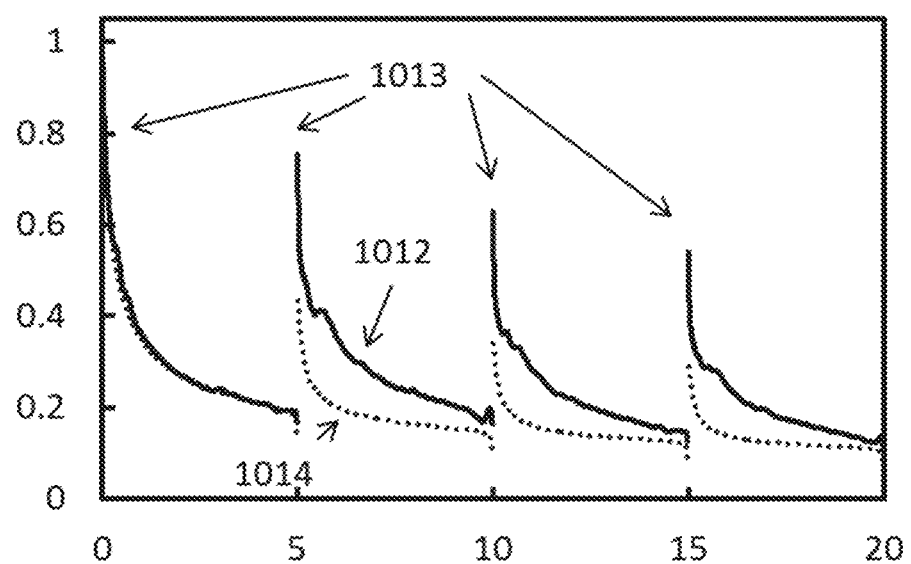
FIG. 10B shows a plot of evaporation rate in a source as shown in FIG. 10 A according to embodiments disclosed herein.

FIG. 10B shows the normalized vapor flux for the arrangement shown in FIG. 10A as a function of path length over the material charge measured from the leading edge of the upstream crucible 1011 in centimeters. Each crucible is 5 cm in length. Each discontinuous length of line reflects the change in mass flux across the length of a tray. The solid line 1012 shows data for the flipping source. Each flip increases j at the leading edge the next downstream crucible 1013 by effectively resetting x in the Nusselt number equation to 0. The overall downward trend in j at the leading edges crucibles is due to the increase in average $P_v$ downstream.

A comparison case in which crucibles are arranged so that flow does not flip is shown by a dotted line 1014. The initial evaporation rate at the leading edge of each subsequent crucible is lower and the evaporation rate decreases more rapidly than in the flip case, because evaporation is impeded by the boundary layer established by the upstream crucible.

Figure 11:
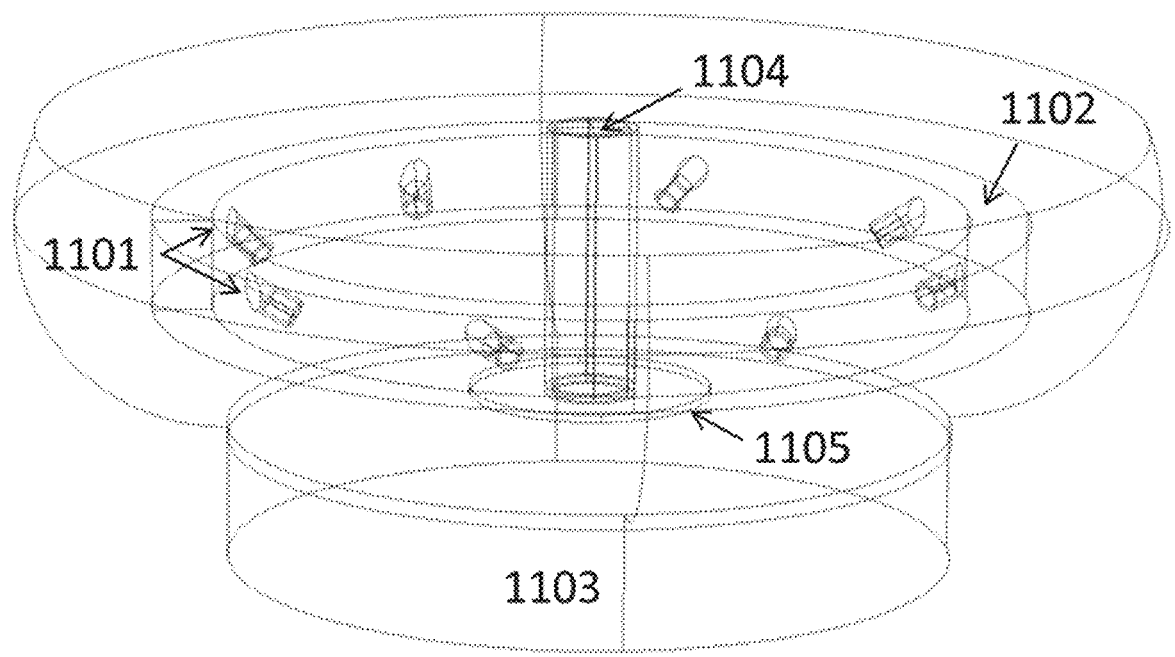
FIG. 11 shows a design of a source cell designed to generate a vortex of carrier gas according to embodiments disclosed herein.

FIG. 11 shows a vortexing source assembly according to an embodiment disclosed herein. In this embodiment, carrier gas enters through injection ports 1101 that are arranged around a central distribution ring 1102. The injection ports 1101 may be in fluid communication with one or more sources of carrier gas. During operation of the cell, the jets of carrier gas combine into a swirl above a crucible of evaporable material 1103, such as organic source material for use in fabricating OLEDs, or the like, disposed within a material charge support. Injectors may be offset from the radii of the round crucible to impart each jet with a relatively significant angular momentum about the center of the crucible. Alternatively or in addition, the injectors may be angled downwards towards the crucible so that carrier gas impinges more directly on the material charge. The vortex may pick up vapor from the material charge as previously disclosed, after which is rises through a flue 1104 at or near the center of the source. The flue may be positioned and oriented such that it is parallel to an axis of the vortex, and may move material in a direction away from the material source along that direction. The carrier gas may rise through the flue 1104 due to pressure differentials and circulation of the gas within the cell, or the flue may be in fluid communication with a vacuum source. The base of the flue may be fitted with a splitter 1105 to increase the path length of streamlines within the vortex and reduce the headspace over the material charge. The vortex drives cells of recirculation around the distribution ring.

Figure 12A:
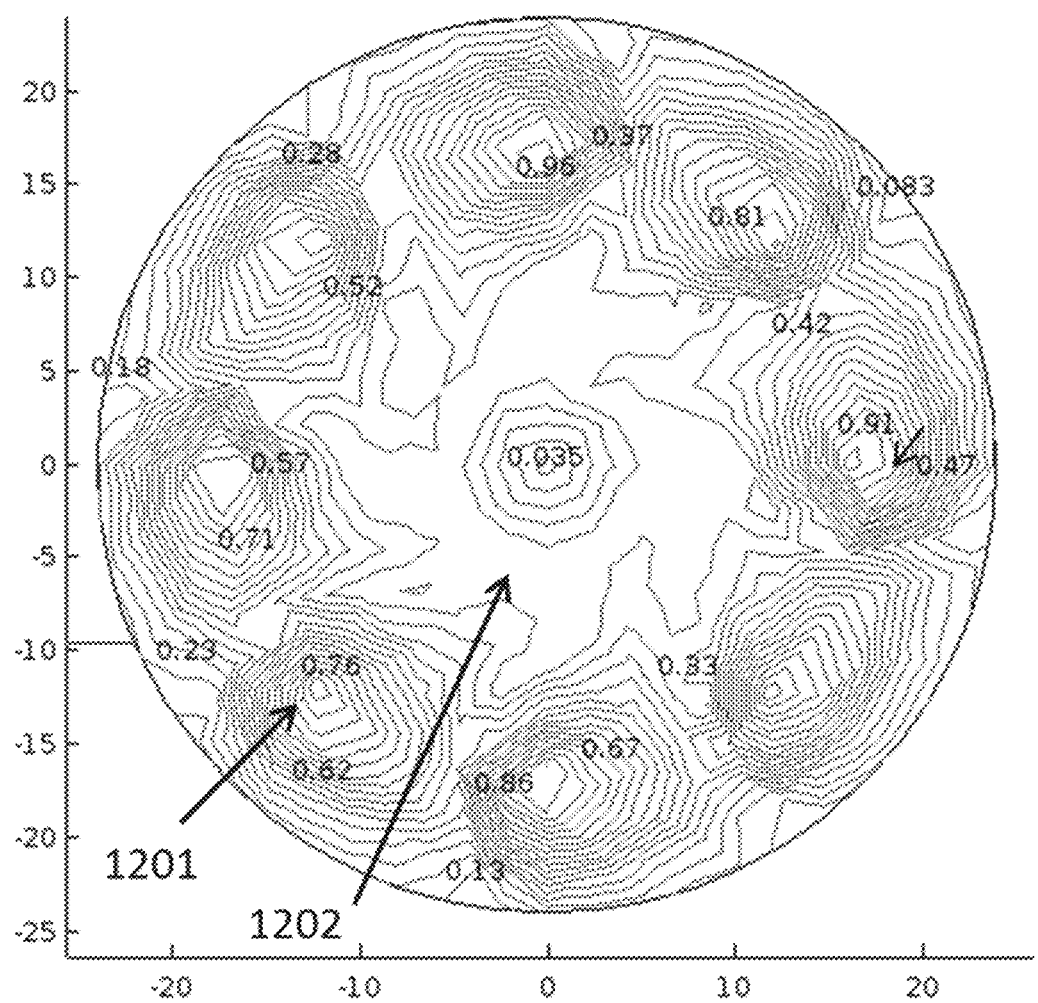
FIGS. 12A and 12B show local rates of evaporation in the crucible of a source cell with a vortex of carrier gas and the flow patterns over the crucible, respectively, according to embodiments disclosed herein.

The effects of an in-plane vortex as shown in FIG. 11 are threefold. First, it maximizes the length of the leading edge of the evaporation interface by introducing carrier gas along the perimeter of a round crucible. FIG. 12A shows a contour plot of the flux of organic vapor from the crucible of a vortexing source as shown in FIG. 11. The contour values are normalized to the maximum evaporation rate. Evaporation is fastest on the edge of the crucible as shown at 1201, close to the carrier gas injectors. This takes full advantage of the sharp peak of Nu at the leading edge of an evaporation bed.

Figure 12B:
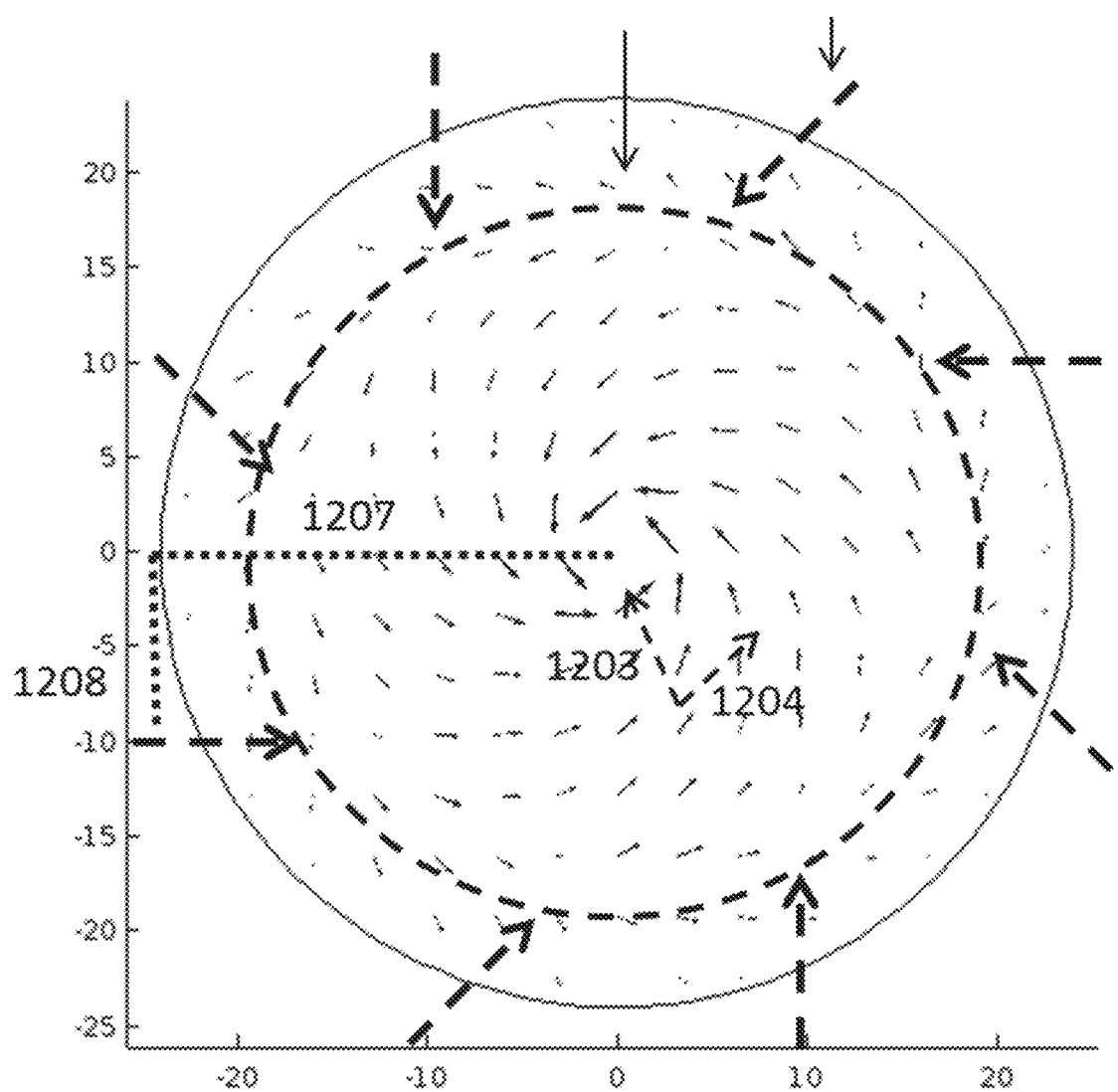

Secondly, the use of an in-plane vortex may increase the path length followed by a given set of carrier gas streamlines passing through the source. Evaporation slows closer to the center of the crucible, as seen at 1202. FIG. 12B shows an arrow plot of the flow velocity in the vortexing source. As shown, the carrier gas rotates over the crucible as it moves towards the center. The radial velocity 1203 is determined by the mass flow. However, the tangential velocity 1204 may be much higher than the radial velocity. This increases the flow velocity for a given mass flow rate through the source, and therefore increases Nu.

Thirdly, the vortex generates cells of mixing and recirculation. These secondary vortices may function like the alternating carrier gas "flips" of the arrangement shown in FIG. 10A, to bring unsaturated or less-saturated carrier gas into contact with the material charge. The effect of the flow splitter (shown as a dashed ring at 1205) is apparent. Flow underneath the splitter is directed inward towards the siphon at the center, while flow outside the splitter edge is directed outward to join the eddies of recirculation. The positions of injectors are illustrated by dashed arrows 1206. Each injector is offset from a parallel radius 1207 by a constant tangential distance 1208.

Figure 13:
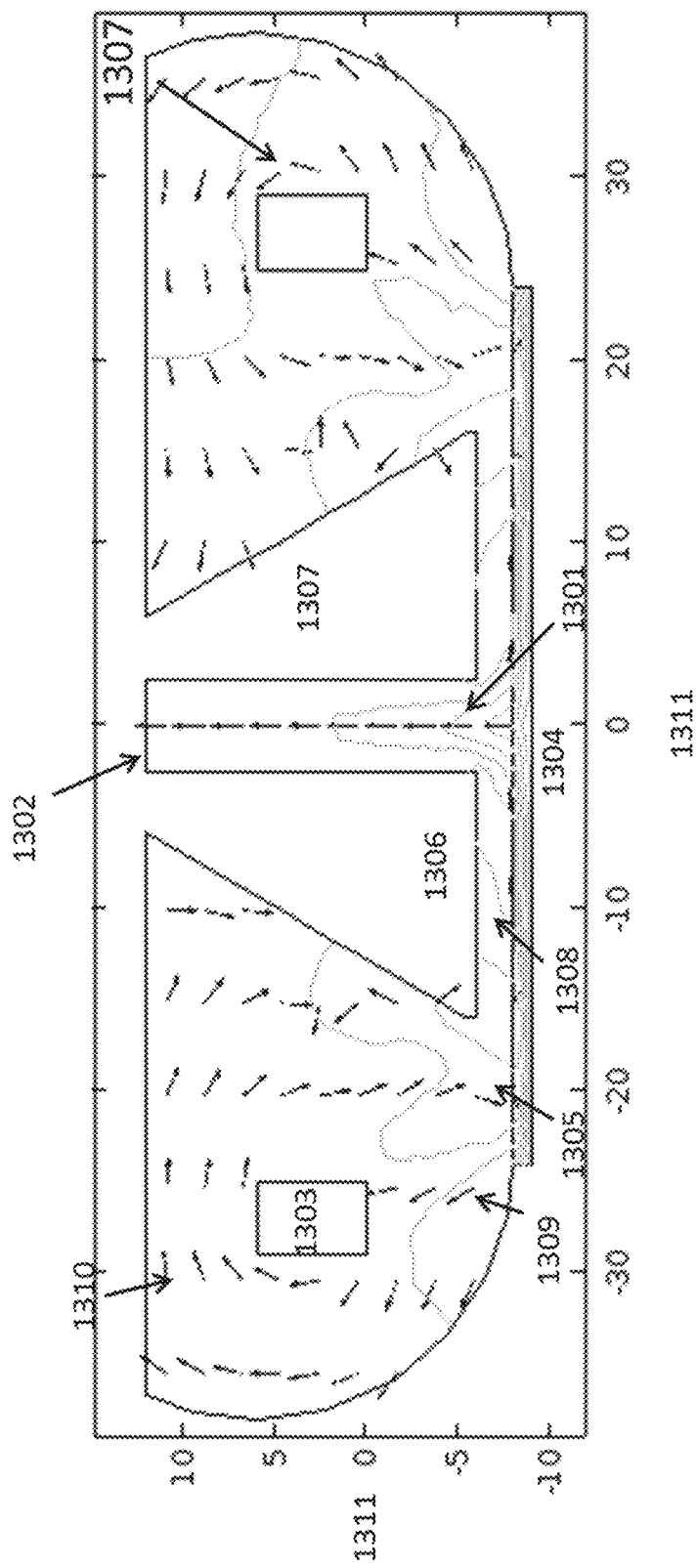
FIG. 13 shows the partial pressures of vapor and the motion of carrier gas in a vortexing evaporation source orthogonal to the plane of the crucible lip according to embodiments disclosed herein.

FIG. 13 shows the vortex flow pattern along a radial cross section of the source cell, which illustrates additional features of the arrangement. The carrier gas flow direction is indicated by arrows. Because of the wide variation in speed between through flows and recirculation flows, the arrows indicate direction only. Normalized vapor concentration is plotted in contours. A plume of vapor rises upward at the center of the vortex, creating a region of high concentration 1301. Saturation of the effluent may be increased or maximized by positioning the flue 1302 through which the carrier gas exits over this region 1301. While the dominant flow is circular, there is a downward flow from the injection ring 1303 towards the crucible 1304. This flow bifurcates as it impinges on the material charge 1305. A splitter disc 1306 covered by a displacer fairing 1307 may guide the carrier gas flow. A portion of the flow moves under the splitter towards the siphon 1308 and exits. Another portion 1309 flows radially outward. The outward flowing gas can be drawn into a recirculation cell 1310 driven by the low-pressure region inside the vortex. This recirculation may permit the carrier gas to contact the material charge multiple times, potentially increasing saturation. The axes 1311 indicate the dimensions of the vessel in mm, though it will be understood that the specific dimensions and scale are provided as an illustrative example only and other dimensions and scales may be used without departing from the embodiments disclosed herein.

Figure 14:
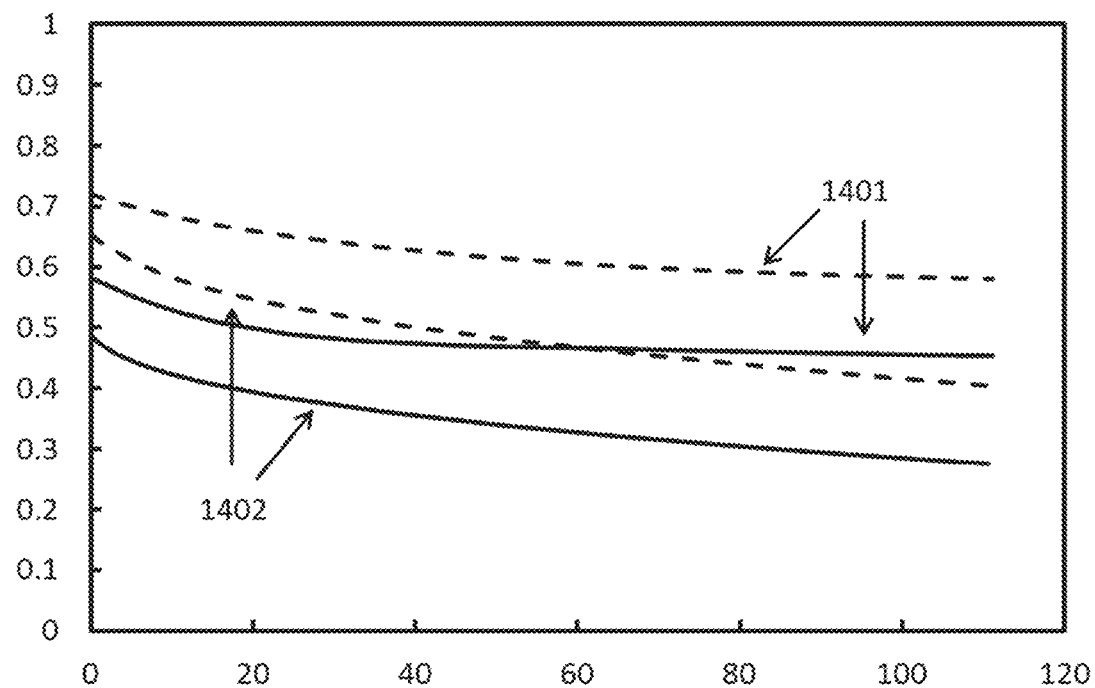
FIG. 14 shows a plot of the saturation of organic vapor in effluent gas from an evaporation source as a function of time for vortexing and non-vortexing carrier gas flows according to embodiments disclosed herein.

FIG. 14 shows a plot that shows additional features and benefits of a vortexing source as disclosed herein. The behavior of $\Theta$ is plotted over time for sources with injectors either offset from radii by 10 mm to generate a vortex, or positioned along the radii so that flow travels directly from the injector to the siphon. The vortexing configuration 1401 and non-vortexing cases 1402 are potted for example carrier gas flows of 500 sccm (dashed line) and 1000 sccm (solid line). It can be seen that the vortex increases the mass transport coefficient between the material charge and the carrier gas, as well increasing its time stability.

A vortexing source as disclosed herein also may make the saturation of the effluent less dependent on the volumetric gas flow rate through the source cell. The effects of the vortex are weak for low flows because the longer residence time of the carrier gas allows it to become saturated with organic vapor. The vortex becomes stronger for high carrier gas flows, offsetting the reduced residence time of the gas with more mixing to improve mass transport from the condensed material interface. Recirculation of carrier gas inside the source helps to prevent evaporated material from building up and re-condensing in regions of stagnant flow.

As seen from these examples, a vortexing source as disclosed herein may improve the lifetime of OLEDs grown using the source. This is because the improved recirculation may reduce or eliminate regions of organic material that otherwise may stagnate and degrade before printing. Additionally, the improved mass transport of the organic vapor source may allow it to generate a given saturation of organic vapor at a lower source temperature. This decreases the overall temperature exposure of the source material and reduces opportunities for material degradation.

Figure 15:
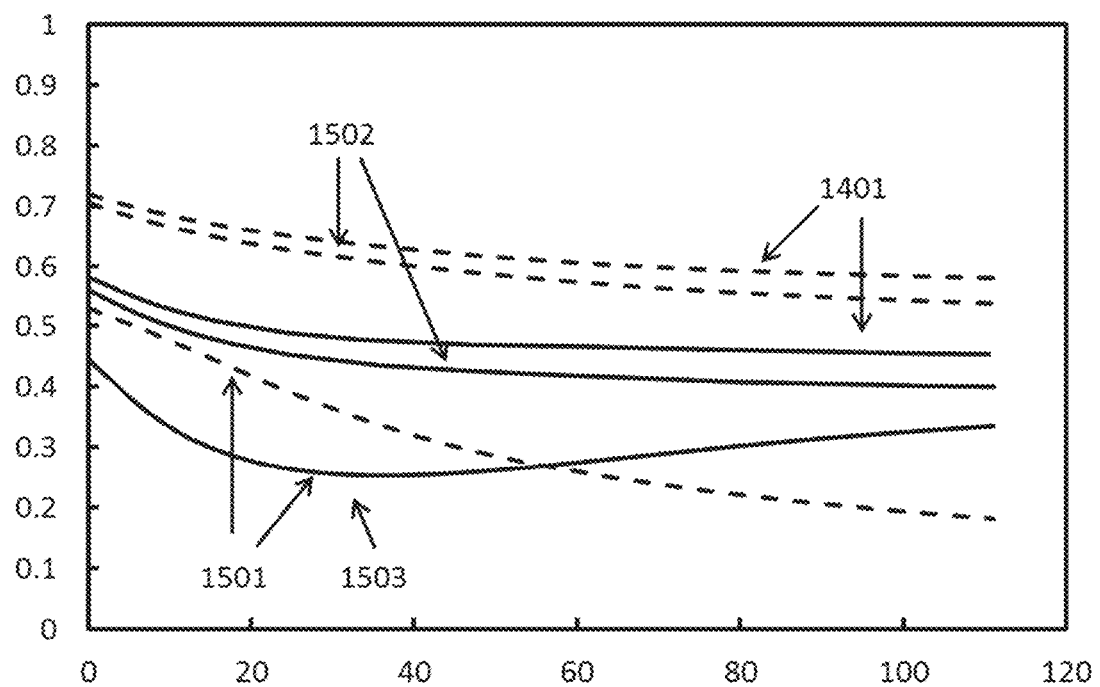
FIG. 15 shows a lot of the saturation of vapor in effluent gas from a vortexing evaporation source as a function of time for various siphon designs according to embodiments disclosed herein.
Figure 16:
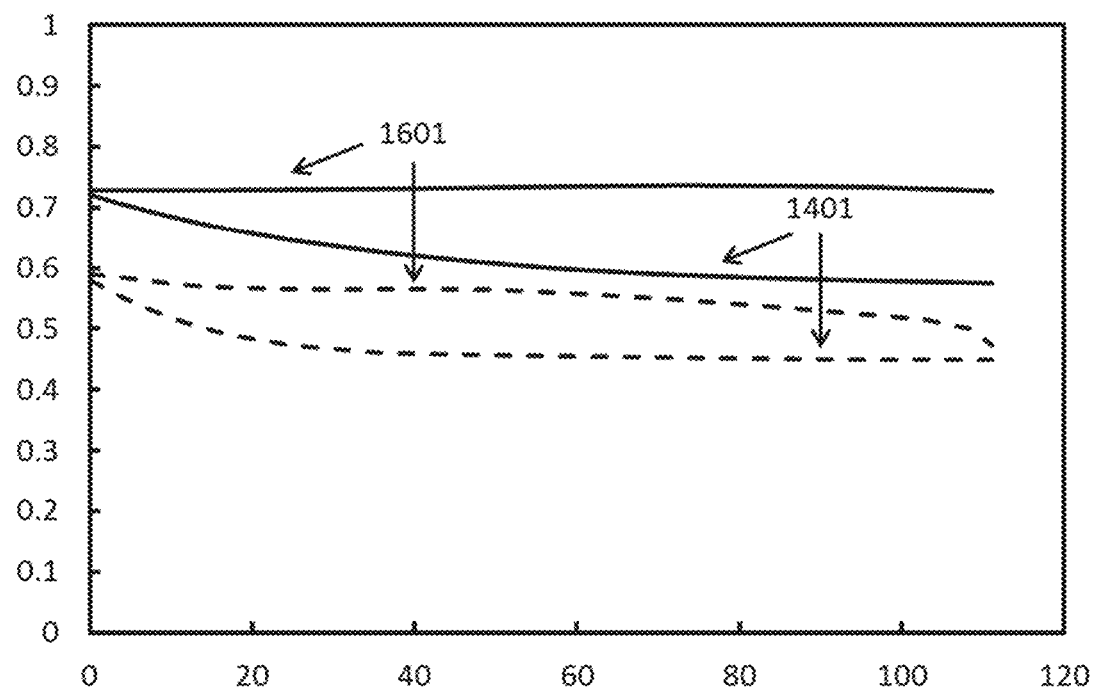
FIG. 16 shows a plot of the saturation of vapor in effluent gas from a vortexing evaporation source as a function of time for moving and fixed siphons according to embodiments disclosed herein.

The presence of the fared flow splitter as disclosed herein also may improve the saturation and time stability of the outgoing flow. For example, FIG. 15 shows the behavior of the saturation $\Theta$ as a function of time (in hours) for cases where the siphon with a 32 mm OD splitter disc and 60° fairing is replaced with a simple a simple 3 mm OD tube

1501. It also shows cases where the splitter plate is retained at 1502, but the fairing above it is removed. As shown, it has been found that the splitter plate redirects streamlines of flow not in contact with the material charge around for another pass and it decreases the effective headspace between the swirling gas and the material charge, thereby improving saturation of the carrier gas. The splitter plate also may provide extremely good time stability after an initial burn in phase of about 20 hr. If the plate is removed, the 500 sccm case shows the saturation Θ dropping rapidly over time, while the 1000 sccm case shows Θ passing through a minimum 1503 at about 30 hrs. This more complex behavior is due to the swirling flow eroding the material charge in a way that increases its surface area. The splitter may be optimized so that this effect is counterbalanced by the increase in headspace as the material erodes and Θ remains stable in time. The fairing over the splitter may improve the saturation and time stability by reducing the dead volume within the source cell.

The siphon may move downward into the crucible to preserve a constant headspace as the charge of material in the crucible recedes. This may maintain Θ at or near its initial value over the lifetime of the material charge and may reduce or eliminate the burn-in period before it stabilizes. The time behavior of Θ for 500 and 1000 sccm carrier gas flow are plotted for a case in which the average headspace under the splitter is maintained at 3 mm 1601. The best cases for a stationary flue are plotted for comparison. In a practical implementation, the position of the siphon may be controlled by a mechanical actuator. The flue may be lowered as a function of deposition tool operating time, or the level of material in the crucible can be measured in situ and held at a constant set point. Alternately, the position of the flue can be varied in time by a control loop designed to maintain a constant partial pressure of vapor in the flue gas. Partial pressure can be measured by a technique such as laser induced fluorescence.

Multiple vortexing sources as disclosed herein also may be connected in series to further increase saturation if desired. If they are operated in series, units within the series may be maintained at different steady state or time varying temperatures in analogy to the multi-tray source discussed earlier. Such a source design is expected to yield similar lifetime benefits for OLEDs grown by a tool equipped with it.

EXPERIMENTAL

For all simulation data provided herein, sources were simulated in COMSOL Multiphysics using the physics packages for laminar flow, fluid heat transfer, and dilute material transport. All simulations assumed an $N_2$ carrier gas at an absolute pressure of 200 Torr and a temperature of 533K unless otherwise noted. The sublimate has $P_v^*=9$ Pa at this temperature. This is the value used in the denominator of Θ. $H_v=79$ kJ/mol.

The linear bed source used in the variable temperature simulations had a headspace of 2 mm, a width of 10 mm, and a length of 25 mm. The crucible is 4 mm deep. The stacked tray case featured four 5×1 cm crucibles connected by a zigzag flow path with a 4 mm headspace. A carrier gas flow of 30 sccm is assumed unless otherwise noted.

The vortexing source consists of a roughly disc shaped enclosure 76 mm in diameter and 20 mm in height. A 48 mm wide and 4 mm deep cylindrical crucible sits beneath it. The injection ring of the vortexing source positioned inside the enclosure. It is 50 mm in diameter with 8 uniformly positioned nozzles. Each injector is offset from the radius by 10 mm unless otherwise noted and angled 40° towards the crucible at the base of the source assembly. The injectors have an ID of 2 mm. The injector block is positioned 9 mm above the crucible lip. The siphon located at the central disc has an inner diameter of 5 mm and a tip 2 mm above the crucible lip. The crucible is initially filled to a level 1 mm below its lip.

Erosion of the material charge and motion of the siphon is modeled using the deformed geometry package in COMSOL. Mesh deformations were calculated using volume changes in the material charge consistent with the calculated deposition rate at each time step. A molar mass of 500 g/mol and a specific gravity of 1.1 were assumed for the material charge.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A source cell for providing a material to be deposited via vapor deposition, the source cell comprising:
    a first material crucible comprising:
        a leading edge and a rear edge;
        a depression disposed between the leading edge and the rear edge of the first material crucible for holding a first material;
    a carrier gas inlet disposed adjacent to the leading edge of the first material crucible;
    a carrier gas outlet disposed adjacent to the rear edge of the first material crucible;
    a first plurality of heaters configured to set a first temperature gradient across the depression of the first material crucible, the first temperature gradient comprising:
        a first temperature adjacent to the leading edge of the first material crucible; and
        a second temperature, at least 20 K higher than the first temperature, adjacent to the rear edge of the first material crucible;
    a second material crucible disposed downstream from the first material crucible, the second material crucible comprising:
        a leading edge and a rear edge;
        a depression disposed between the leading edge and the rear edge of the second material crucible for holding a second material; and
        a first vent in fluid communication with the carrier gas outlet of the first material crucible; and
    a second plurality of heaters configured to set a second temperature gradient across the depression of the second material crucible independently of the first temperature gradient across the first material crucible, the second temperature gradient comprising:
        a first temperature adjacent to the leading edge of the second material crucible; and
        a second temperature, at least 20 K higher than the first temperature, adjacent to the rear edge of the second material crucible.

2. The source cell of claim 1, further comprising:
a third material crucible disposed downstream the second material crucible, the third material crucible comprising:
   a depression for holding a third material to be deposited via vapor phase deposition; and
   a second vent in fluid communication with the second material crucible; and a third heater configured to set a temperature of the third material crucible independently of the temperature of the first and second material crucibles.

3. The source cell of claim 1, further comprising the first material.

4. The source cell of claim 3, further comprising the second material and the third material, and wherein the first, second, and third materials comprise the same material.

5. The source cell of claim 3, wherein the first material is an organic emissive material.

6. The source cell of claim 1, wherein the first vent comprises an inverting connection between the first crucible and the second crucible.

7. The source cell of claim 6, wherein the second vent comprises an inverting connection between the second crucible and the third crucible.

8. The source cell of claim 1, wherein the second crucible is disposed over the first crucible.

9. The source cell of claim 8, wherein the third crucible is disposed over the second crucible.

10. The source cell of claim 1, wherein, during operation of the source cell in a vapor deposition system, the source cell is configured to maintain a temperature of at least a portion of the first crucible at a lower temperature than at least a portion of the second crucible.

11. The source cell of claim 10, wherein, during operation of the source cell in the vapor deposition system, the source cell is configured to maintain a temperature of at least a portion of the second crucible at a lower temperature than the third crucible.

12. The source cell of claim 1, wherein, during operation of the source cell in a vapor deposition system, the source cell is configured to change the temperature of the first crucible and temperature of the second crucible over time.

* * * * *